United States Patent [19]
Wiedmann

[11] Patent Number: 5,477,489
[45] Date of Patent: Dec. 19, 1995

[54] HIGH-STABILITY CMOS MULTI-PORT REGISTER FILE MEMORY CELL WITH COLUMN ISOLATION AND CURRENT-MIRROR ROW LINE DRIVER

[75] Inventor: Siegfried Wiedmann, Santa Clara, Calif.

[73] Assignee: Exponential Technology, Inc., San Jose, Calif.

[21] Appl. No.: 407,505

[22] Filed: Mar. 20, 1995

[51] Int. Cl.$^6$ ....................................... G11C 7/00
[52] U.S. Cl. ............... 365/189.04; 365/154; 365/230.05
[58] Field of Search .................. 365/189.04, 230.05, 365/230.06, 154

[56] References Cited

U.S. PATENT DOCUMENTS

| | | | |
|---|---|---|---|
| 5,003,509 | 3/1991 | Bosnyak | 365/154 X |
| 5,083,295 | 1/1992 | Lammerts et al. | 365/205 |
| 5,282,174 | 1/1994 | Little | 365/230.05 |

Primary Examiner—David C. Nelms
Assistant Examiner—Son Dinh
Attorney, Agent, or Firm—Stuart T. Auvinen

[57] ABSTRACT

A memory cell has the read current from the bit lines isolated from the bistable storage latch in the cell. Internal nodes of the bistable storage latch control isolated gates of MOS read transistors which gate the read current from the bit lines to a local node within the memory cell. The read current is then switched to ground from the local node by a read switch transistor. The read switch transistor is gated by the read row line. The read current is isolated from the read row line because the read row line is only connected to the isolated gate of the read switch transistor. The read current is also isolated from the bistable storage latch since the read transistors are connected at their isolated MOS gates to the bistable's nodes. This isolation of the read current allows additional read ports to be added without disrupting the cell's stability or write performance. The read ports are optimized independently of the bistable stability and write performance and even optimized independently of other read ports. For allowing better control of the read currents, a current-mirroring row driver causes the current in the row driver to be mirrored by the read currents flowing through the read switch transistors.

21 Claims, 6 Drawing Sheets

HIGH-STABILITY CMOS MULTI-PORT REGISTER FILE MEMORY CELL WITH COLUMN ISOLATION AND CURRENT-MIRROR ROW LINE DRIVER

BACKGROUND OF THE INVENTION—FIELD OF THE INVENTION

This invention relates to CMOS memory cells, and more particularly to a memory cell with multiple ports and isolation read transistors.

BACKGROUND OF THE INVENTION—RELATED APPLICATION

This application is related to "BiCMOS Static RAM with Active-Low Word Line", filed Aug. 31, 1994, U.S. Ser. No. 08/298,593, having a common inventor and assigned to the same assignee.

BACKGROUND OF THE INVENTION—DESCRIPTION OF THE RELATED ART

Random access memories (RAMs) have increased in speed and density at a rapid pace. Complementary metal-oxide-semiconductor (CMOS) devices have been used extensively in constructing arrays of memory storage cells. CMOS technology provides very high densities of memory cells using n-channel and p-channel MOS transistors.

SINGLE-PORT MEMORY CELLS

A popular CMOS memory cell is the six-transistor (6T) cell. FIG. 1 shows a typical prior-art 6T cell. The cell stores a bit of data in a cross-coupled storage latch consisting of two CMOS inverters. Load transistor 12 and driver transistor 16 form the first inverter, and load transistor 14 and driver transistor 18 are the second inverter. The output of one inverter is coupled to the input or gates of the other inverter. Pass transistors 20, 22 selectively connect a memory cell to a pair of bit lines 24, 26, when a word or row line 28 is activated by placing a sufficiently high voltage on it. The high row-line voltage turns on pass transistors 20, 22, causing them to conduct and connect the memory cell to the external bit lines. The construction and operation of the 6T cell is well-known in the art.

The 6T cell uses p-channel load transistors 12, 14, and n-channel driver transistors 16, 18. Because the hole mobility of p-channel transistors is lower than the electron mobility of the n-channel transistors, the p-channel transistors must be two or three times as large as an n-channel transistor to drive a desired current. The size of the transistor is defined by the "W/L" ratio, the ratio of the width of the channel or gate to the channel length. For a perfectly balanced cell, the W/L of the load transistors 12, 14 would be twice as large as the W/L for the driver transistors 16, 18. However, the bit lines 24, 26 have a limited voltage swing and are biased at an intermediate voltage level. A typical 6T cell might have the bit lines 24, 26 biased at 3.0 volts for a 5-volt power supply. Under these conditions, the cell is read by applying 5 volts to the row line 28, turning on pass transistors 20, 22. Thus a more typical cell has the W/L of the load transistors 12, 14 half as large as the W/L for the driver transistors 16, 18.

Cell stability on a read is an important design criteria. The bit lines 24, 26 are relatively large and have a high capacitance. Charge sharing between bit lines 24, 26 and the cell can cause the cross-coupled latch in the cell to accidentally change state, losing the data stored in the cell. Cell stability is achieved by making pass transistors 20, 22 smaller than the driver transistors 16, 18: the pass transistors 20, 22 usually being about ⅓ the size of the driver transistors. The load transistors are made as small as possible to enhance cell switching while still stabilizing the cell against data loss. The load transistors are often just "leaker" transistors, designed to maintain the high logic state of one node in the cell when the cell is decoupled or deselected from the bit lines 24, 26. By keeping the load transistors 12, 14 small, the driver transistors 16, 18 only need be large enough to maintain cell stability when the pass transistors 20, 22 are turned on. Larger load transistors 12, 14 would impede cell switching.

As an example, typical minimum sizes in microns for the three types of transistors in a memory cell are 1/1 for the n-channel pass transistors 20, 22, 3/1 for the n-channel driver transistors 16, 18, and 1/5 for the p-channel load transistors 12, 14. Thus the current drive for the three types of devices might be 150 uA (microamps) for the pass transistors 20, 22, and 600 uA for the driver transistors, while less than 100 uA for the load transistors because of the lower saturation current of the p-channel transistors.

The driver transistors are characterized by having a high current drive, while the load transistors are characterized by a relatively small current drive. The pass transistors 20, 22, have an intermediate current drive, dictated by cell stability. All transistors are made as small as possible to achieve high density, but the relative sizes of the transistors must be carefully chosen.

MULTI-PORT MEMORY CELLS

Certain applications require simultaneous access to memory cells. A register file in a pipelined processor will often be read by two or three sources, and also written by two or more additional sources. Thus multi-port memory cells are needed for a processor's register file. A simple extension of the 6T memory cell of FIG. 1 is to provide additional pairs of pass transistors for the additional ports. Unfortunately, cell stability can be compromised when multiple ports access the same cell, as several pass transistors can each draw read currents from the memory cell. These additional currents can draw enough charge to disrupt the cross-coupled latch in the memory cell. Thus the pass transistors must be made smaller to prevent cell disrupt on read: for two simultaneous read ports, the size of the pass transistors must be cut in half. Half-size pass transistors will approximately double the read access time.

FIG. 2 shows that the read ports can be isolated from the cell's storage latch 302 by connecting the gates of read transistors 308, 308', 310, 310' to the storage nodes of the cross-coupled storage latch 302 in the memory cell. The source and drain of read transistor 308 are connected between read bit line 320 and the row line 340, and the read current flows from the bit line 320 to the row line 340, rather than directly from the cross-coupled storage latch 302 in the memory cell to the bit line 320. The read current is controlled by the gate of read transistor 308, which is coupled to the storage latch 302. Thus the memory cell may be read without drawing the read current out of the cross-coupled storage latch 302 in the memory cell. It should be noted that the direction of the read current may be reversed by the bias on the read bit line 320 and row line 340.

This approach is disclosed by J. M. Huard in U.S. Pat. No. 5,189,640, assigned to National Semiconductor Corporation of Santa Clara, Calif. His FIG. 6 shows that the read pass transistors 308 are coupled between the read bit lines and the row lines (read enable line). This has the disadvantage that a large read current may flow through the row lines. A significant I-R drop may occur as this read current flows across the row line, since the row line typically has high resistance. The row lines also have high capacitance from the sources of many read transistors connected to the row line. Thus there may be a significant R-C delay to activate the row lines.

PROBLEMS WITH READ CURRENT THROUGH ROW LINES

FIG. 3 highlights the prior-ann problem with read current flowing through the row lines. Several columns A, B, C in a memory array are shown. For each column, a single pair of bit lines 320A–C, 322A–C are shown driving sense amplifiers 324A–C. In a multi-port memory, additional read ports and sense amplifiers may also be present as well as write ports, but they are not shown for simplicity. While many rows are present, a single row is shown of cells 302A–C read by word or row line 340. Row line 340 is driven by row driver 330.

In this example, cells 302A–C (and others not shown) are all read by row driver 330 driving a low voltage onto row line 340. Bit lines 320A–C, 322A–C are precharged or biased to a high voltage, and supply read currents 350A–C through read transistors 308A–C (or other read currents not shown through read transistors 310A–C for inverse data) when row line 340 is driven to a low voltage. When a sufficient read current 350A–C flows, the voltage on bit lines 320A–C falls, which is sensed and amplified by sense amplifiers 324A–C. Because bit lines 320A–C are often long having a high capacitance, read currents 350A–C must be large enough to cause a voltage change that can be quickly sensed.

Row line 340 is often long with a high capacitance and resistance. These read currents 350A–C are summed together and flow through parasitic resistance 332 in row line 340. This causes an I-R voltage drop, effectively raising the source voltage of read transistors 308A–C. The higher source voltage reduces the current drive of these read transistors 308A–C, increasing the access time to read cells 302A–C.

When all columns of cells are read at the same time, the read currents are summed together, shown as current 350S. This can be a large current, with a large I-R drop across parasitic resistance 332. Electromigration failure of metal traces used for row line 340 may result from running too large of a current through row line 340. Row line 340 may have to be made wider to reduce current density and limit the electromigration problem. However, the wider row lines increase the capacitance and delay of these row lines, and increases the size of the memory array. The current 350S can be reduced by activating only a few columns, but at the expense of not being able to read all columns at once. Additional circuitry is then needed to decode columns and to discharge bit lines for non-selected columns. However, even when only 32 columns for a single 32-bit word are selected, the current can still be high: if each cell's read current is 200 µA, then the total current is 6.4 mA, a large current for a row line in an integrated circuit.

I-R DROP AND ACCESS TIME VARIES WITH LOCATION OF CELL IN ARRAY

This I-R drop is not constant for all columns of cells. Since parasitic resistance 332 is actually part of a resistance distributed over the entire length of row line 340, cells that are farther away from row driver 330 will have a greater resistance along row line 340 than cells closer to row driver 330. Thus cell 302A close to row driver 330 will see a smaller I-R voltage drop than remote cell 302C. The additional resistance 334 that read current 350C has to flow through causes an additional I-R voltage drop. Thus read transistor 308C will have a source voltage that is higher than for read transistor 308A. Cell 302C will consequently be sensed and read more slowly than cell 302A. The differential in read delays (access times) between cells and columns in a memory array is very undesirable as the overall access time must be limited to the access time for the slowest cell, 302C.

BiCMOS CELLS

Recently BiCMOS processes have emerged. BiCMOS includes both n-channel and p-channel CMOS transistors, and bipolar transistors. NPN and PNP bipolar transistors and resistors are available in BiCMOS processes. Bipolar transistors have a much higher current-drive capability than CMOS transistors, but are not as compact in area as CMOS transistors. Bipolar transistors are used in BiCMOS chips for output drivers and internal clock drivers and other circuits requiring the high current-drive that bipolar can deliver.

What is desired is a multi-port memory cell having read transistors that isolate the cross-coupled latch in the memory cell. It is also desired that the read current not flow through the row lines. It is further desired to have multi-port memory cell and row-line driver circuits particularly adapted for a BiCMOS process.

SUMMARY OF THE INVENTION

A memory cell has multiple ports. The storage nodes of the cell are isolated from the read currents for the multiple ports. The read current is also isolated from the read row line. A read switch transistor switches the read currents to a current sink in response to the read row line, isolating the read current from the read row line. Thus the read currents are prevented from disturbing the bit of data stored in the cell.

A multi-port memory has a read row line for activating a row of memory cells. A memory cell has a bistable storage means that has two stable states, for storing a bit of data. A write means is for changing from a first of the two stable states to a second of the two stable states of the bistable storage means. A read port means reads which of the two stable states is stored in the bistable storage means. The read port means has differential read means for gating a read current in response to the bistable storage means. The differential read means isolates the bistable storage means from the read current. The read current is prevented from disturbing the bit of data stored in the bistable storage means.

A read switch means receives the read current from the differential read means, and switches the read current to a current sink in response to the read row line, isolating the read current from the read row line. Thus the read current flows through the differential read means and the read switch means to the current sink, but the read current is isolated from the bistable storage means and the read row line.

In further aspects of the invention the read current flows through a first substrate channel electrically isolated from the bistable storage means by a first gate oxide. The read current flows through a second substrate channel electrically isolated from the read row line by a second gate oxide. The first substrate channel and the first gate oxide comprise a first MOS transistor, while the second substrate channel and the second gate oxide comprise a second MOS transistor.

The differential read means comprises the first MOS transistor and a third MOS transistor, a gate of the first MOS transistor coupled to a first internal node of the bistable storage means and a gate of the third MOS transistor coupled to a second internal node of the bistable storage means, the first and second internal nodes has opposite logic states.

In other aspects a first read bit line is coupled to the first substrate channel of the first MOS transistor, while a second read bit line is coupled to a third substrate channel of the third MOS transistor, the first and second read bit lines biased at a voltage to allow conduction through either the first substrate channel or the third substrate channel in response to the bistable storage means when the read row line is activates the row of memory cells.

In still further aspects the read switch means comprises the second MOS transistor, and the read row line is connected to a gate of the second MOS transistor. The second substrate channel of the second MOS transistor has a source end of the second channel connected to a current sink and a drain end of the second channel coupled to the first MOS transistor and the third MOS transistor. A local node connects the drain end of the second channel of the second MOS transistor and source ends of the first substrate channel of the first MOS transistor and the third substrate channel of the third MOS transistor. The local node is within the memory cell. In further aspects of the invention the current sink is a ground line or an active current sink.

In other aspects of the invention a row driver has a switchable current source for supplying a row driver current in response to a row select signal. The switchable current source is coupled to the row line. A saturation transistor has a gate and a drain coupled to the row line, for sinking the row driver current to ground. Thus the row driver current flowing through the saturation transistor is mirrored to determine the read current flowing through the read switch means.

DETAILED DESCRIPTION

The present invention relates to an improvement in memory cells. The following description is presumed to enable one of ordinary skill in the art to make and use the invention as provided in the context of a particular application and its requirements. Various modifications to the preferred embodiment will be apparel to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
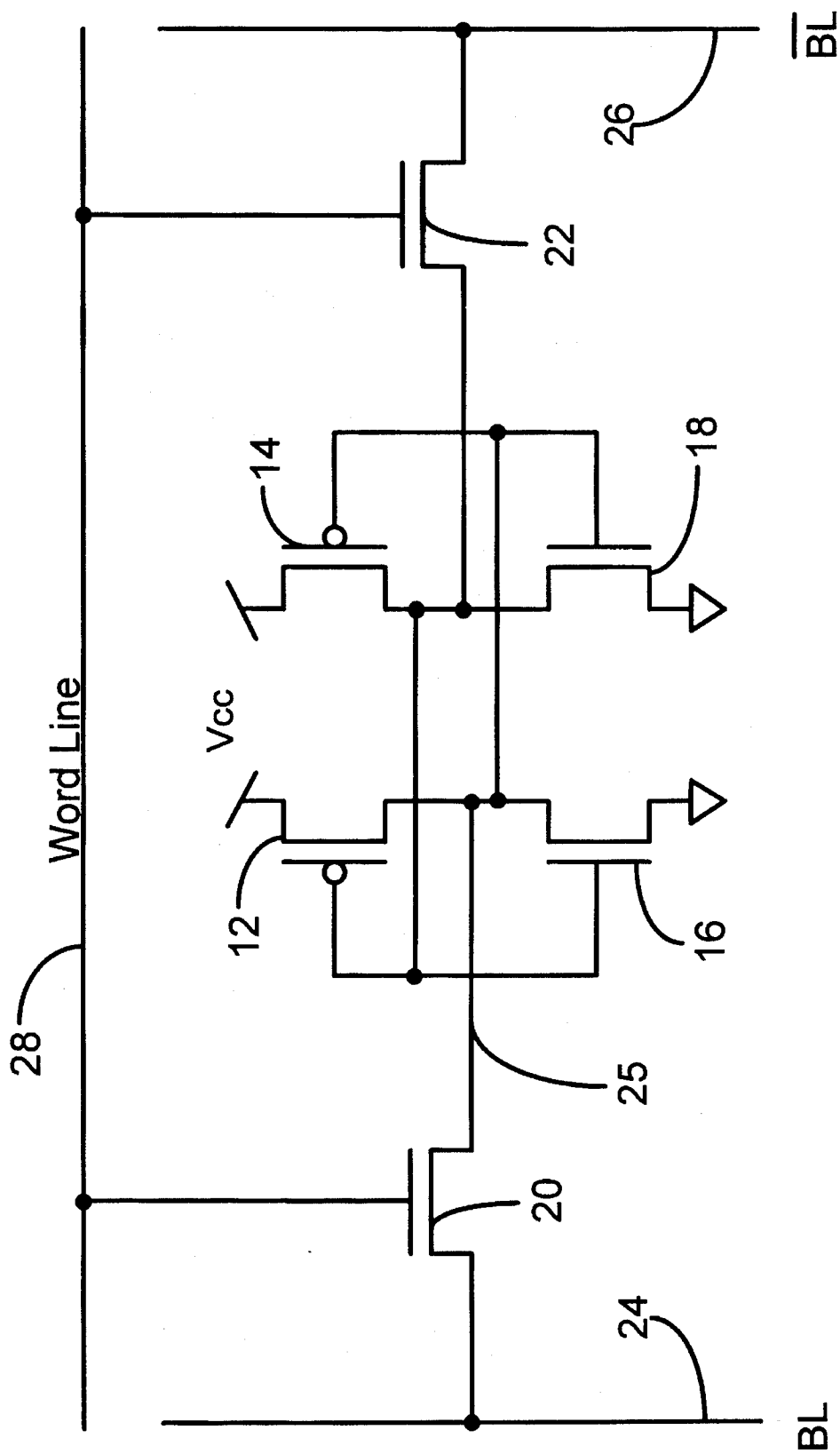
FIG. 1 shows a typical prior-art 6-transistor cell.
Figure 2:
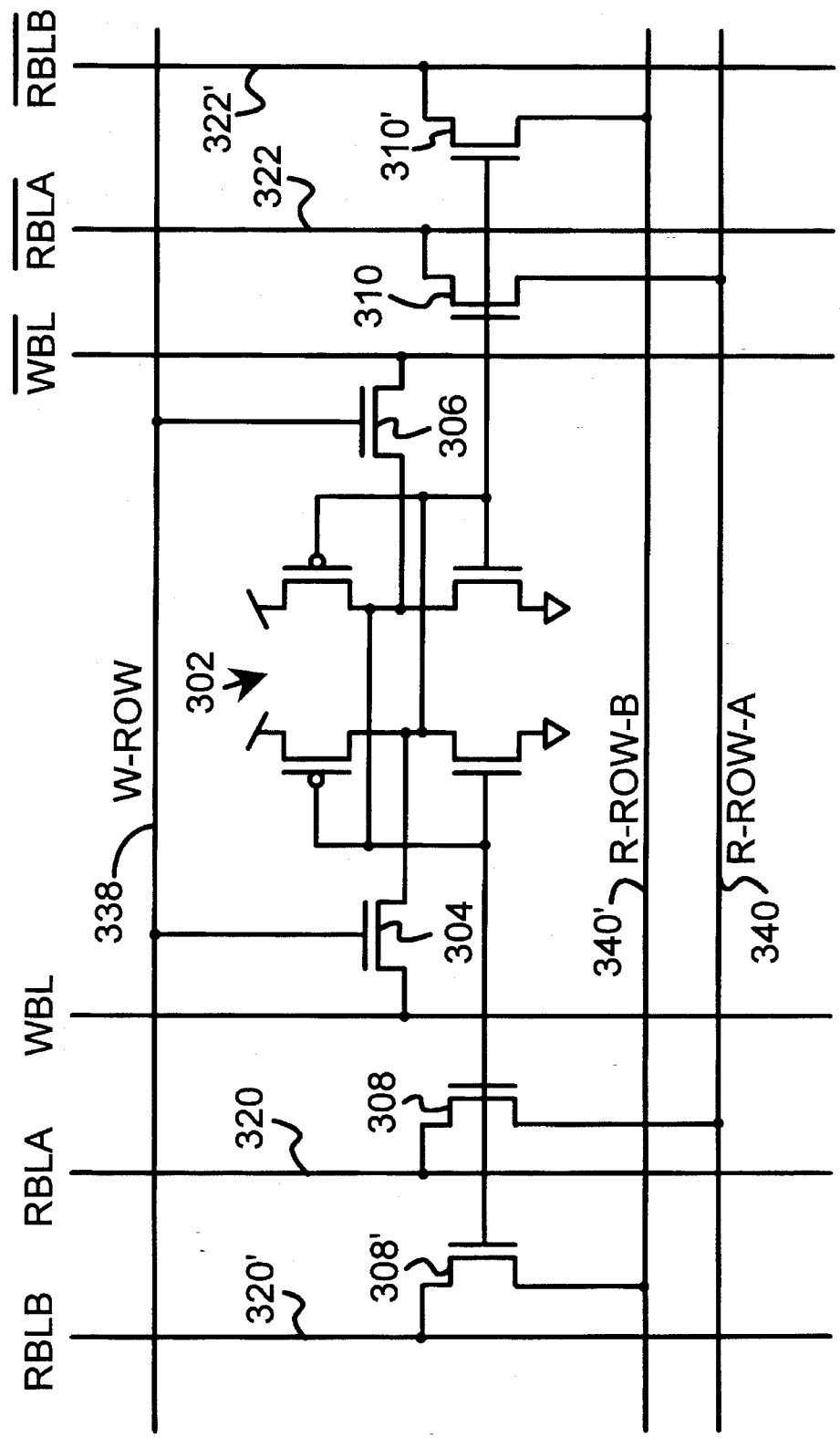
FIG. 2 shows read ports isolated from the cell's storage latch.
Figure 3:
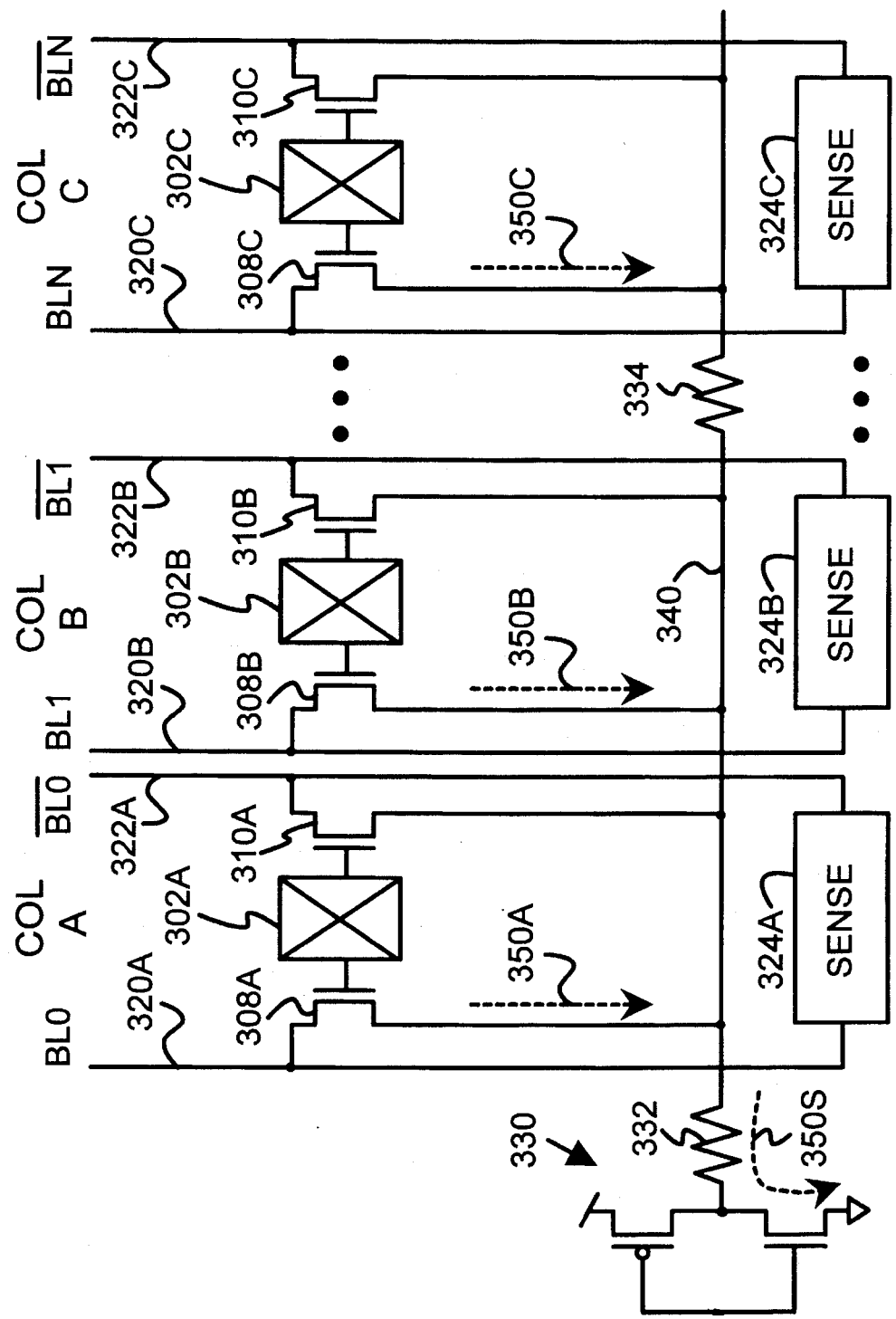
FIG. 3 highlights the prior-art problem with read current flowing through row lines.
Figure 4:
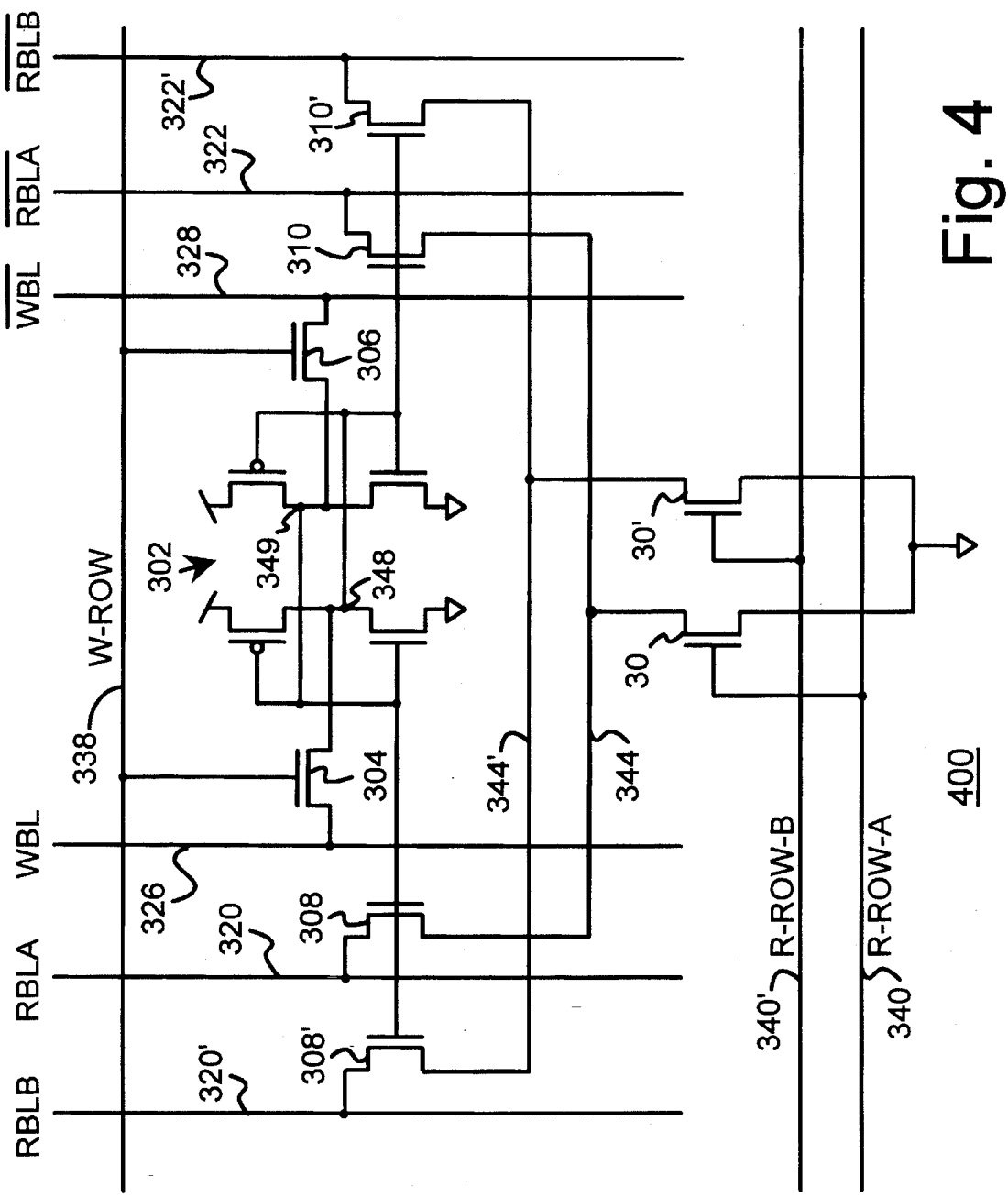
FIG. 4 is a schematic diagram of a multi-port memory cell with current isolation.

FIG. 4 is a schematic diagram of a multi-port memory cell with current isolation. Cell 400 contains storage latch 302 composed of cross-coupled CMOS inverters. This storage latch 302 has two stable states and is sometimes referred to as a bistable. A first stable state occurs after a relatively high voltage is written to node 348 of storage latch 302, while a second stable state occurs after a relatively low voltage has been written to node 349 of storage latch 302. A low voltage applied to a bit line is often ground or a voltage transitioning toward ground, while a high voltage applied to a bit line can be 3.3 volts, or a transistor threshold below the power supply. Just a slight difference in the low and high voltages seen inside the cell at nodes 348, 349 is enough to change the state of the cell, especially when two bit lines with a voltage difference are applied to the bistable during a write. For clarity, one write port and two read ports are shown for cell 400 of FIG. 4, although the number of read and write ports can be varied.

Cell 400 can be broken down into several functional groups of transistors:

1. Storage Latch 302 consists of two cross-coupled CMOS inverters.

2. Write Port consists of write pass transistors 304, 306, and write bit lines 326, 328.

3. Read Port "A" consists of read transistors 308, 310, and read bit lines 320, 322.

4. Read Port "B" consists of read transistors 308', 310', and read bit lines 320', 322'.

5. Read switches consist of read switch transistor 30 and local node 344 for read port "A", and read switch transistor 30' and local node 344' for read port "B", Cell 400 is written to by write pass transistors 304, 306, which couple the internal storage nodes of storage latch 302 to write bit lines 326, 328 when a high voltage is driven onto write row line 338. One of the write bit lines 326, 328 is driven low while the other write bit line remains high, forcing storage latch 302 to change state to match the state of the write bit lines 326, 328.

Read Ports Do Not Draw Current from Storage Latch

Read port A uses read transistors 308, 310 to couple either read-bit line 320 or complement read-bit line 322 to local node 344, depending upon the logic state of storage latch 302. No D.C. current is drawn from storage latch 302 for reading, since the internal nodes of storage latch 302 are coupled to the gates of read transistors 308, 310. A characteristic of metal-oxide-semiconductor (MOS) transistors is that the control gate is electrically isolated from the conducting channel in the substrate between the source and drain of the transistor by a non-conducting gate oxide, usually silicon dioxide, $SiO_2$. Of course, the gate is also isolated from the substrate body.

Other read ports likewise do not draw current from storage latch 302, since internal nodes are only connected to isolated gates of read transistors. Read port "B" operates in a manner similar to read port "A", using read transistors 308', 310' to couple either read-bit line 320' or complement read-bit line 322' to local node 344', depending upon the logic state of storage latch 302.

These read transistors 308, 310 act as a differential pair of transistors, and can amplify a small voltage difference between the two internal nodes of the storage latch if necessary. However, the bistable nature of the storage latch will usually cause the storage latch to output voltages near the power supply voltages, as feedback strongly drives the bistable to the power rails rather than to an intermediate voltage. Thus one of the differential pair of read transistors 308, 310 has its gate at the power supply voltage while the other has its gate at ground. Thus in steady-state one transistor will be turned completely off while the other will be conducting.

Row Lines Isolated From Read Currents

Read Row lines 340, 340' no longer carry read currents from the bit lines. Instead, the read currents from the bit lines are switched on and off by read switch transistors 30, 30'. The row lines 340, 340' are changed from a current-carrying line to a voltage driven line that carries no D.C. current. The only current flowing through row lines 340, 340' is a transient current to charge and discharge the gates of the read switch transistors and the parasitic capacitances along row lines 340, 340'.

Row line 340 is connected to the isolated gate of read switch transistor 30, which sinks the read current from bit lines 320, 322. The source of read switch transistor 30 is grounded, while the drain is connected to local node 344. Local node 344 receives the read current from either read bit line 320 or from read bit line 322, depending upon the logic state of storage latch 302. When a "one" was written into storage latch 302 by pulling complementary write bit line 328 low, then the internal storage node driving the gate of read transistor 308 will be low, turning off read transistor 308. However, the other internal storage node driving the gate of read transistor 310 will be high, turning on read transistor 310. Read current will flow from complementary read bit line 322 through read transistor 310 to local node 344, and then to ground through read switch transistor 30.

Conversely, when storage latch 302 holds a "zero", read transistor 308 will be on but read transistor 310 will be off, coupling read bit line 320 to local node 344. The read current will flow from read bit line 320, through read transistor 308 to local node 344, and then to ground through read switch transistor 30.

Additional Read Ports Do Not De-Stabilize Storage Latch in Cell

The operation of other read ports, such as read port "B", is similar to the operation of read port "A" described above. FIG. 4 shows a second read port labeled "B" with primed reference numerals. Additional read ports may be added by including additional pairs of read transistors 308', 310' and read bit lines 320', 322'. Additional local nodes such as 344' and read switch transistors such as 30' must also be added for each additional read port. Additional read ports do not reduce the D.C. stability of storage latch 302 since additional read currents are not drawn from storage latch 302, except small transient currents to charge the gates of read transistors.

Transistor Device Size Optimization Easier

Transistor sizes for the various ports can be adjusted and optimized independently of one another. The read currents can be adjusted by changing the size of the read transistors 308, 310 and the read switch transistor 30. Each read port may have different size read transistors, supplying substantially larger read currents for ports that are more speed-critical than others. This is especially a benefit in processor design, since some sources in a processor may require a faster access time than other sources.

For example, a read port for supplying an operand from a register file to an address generate stage of a processor may require a fast access time, because an addition operation may need to be performed on the operand once it is fetched from the register file. However, another port that reads an operand from the register file and sends the operand to a pipeline register may not need as fast of an access time, since the operand is not sent through an adder, but is merely stored in a register. Thus access times required may vary for different ports to a register file in a pipelined processor. The present invention can take advantage of these different requirements by using larger read transistors for faster read ports, but using smaller read transistors for read ports that can be slower. This not only reduces the die area for the register file memory, but can also reduce power consumption as smaller read currents are used for slower ports.

Additional write ports can also be added by including additional pairs of write pass transistors such as 304, 306 and write bit lines 326, 328, and an additional write row line 338. While these write ports can be optimized and adjusted independently of the read ports, the write ports do affect each other if they can simultaneously write to the same cell. Simultaneous writing is rare for a pipelined processor since it indicates a conflict. Such resource conflicts are normally detected and avoided. Additional read and write ports do add capacitance to the internal nodes of storage latch 302, but this is not a D.C. design factor.

Since the read current is no longer drawn from the storage latch 302, the driver transistors in storage latch 302 do not have to be as large as in the prior art to supply the read current. Not only may this help reduce memory cell area, it allows for faster writing to the storage latch, since the smaller driver transistors are more easily overcome by the data being driven onto the write bit lines. The write pass transistors 304, 306 may also be made smaller due to the faster write. Smaller driver transistors have a smaller capacitance, reducing the charge that must be driven into the cell to flip the state of the storage latch 302 on a write.

The read switch transistors can be sized small to reduce the gate capacitance for the read row lines 340, 340'. However, larger sizes can increase the read current. Likewise, larger read transistors 308, 310 provide more read current and faster sensing, but increase the capacitance on the internal nodes of storage latch 302, which can somewhat increase delays for writing. A design optimization that includes the sense amplifiers is needed to choose the best combination of device sizes for a target access time. Typical sizes in microns for these transistors in a 0.5 micron process is shown in Table 1.

TABLE 1

Figure 5:
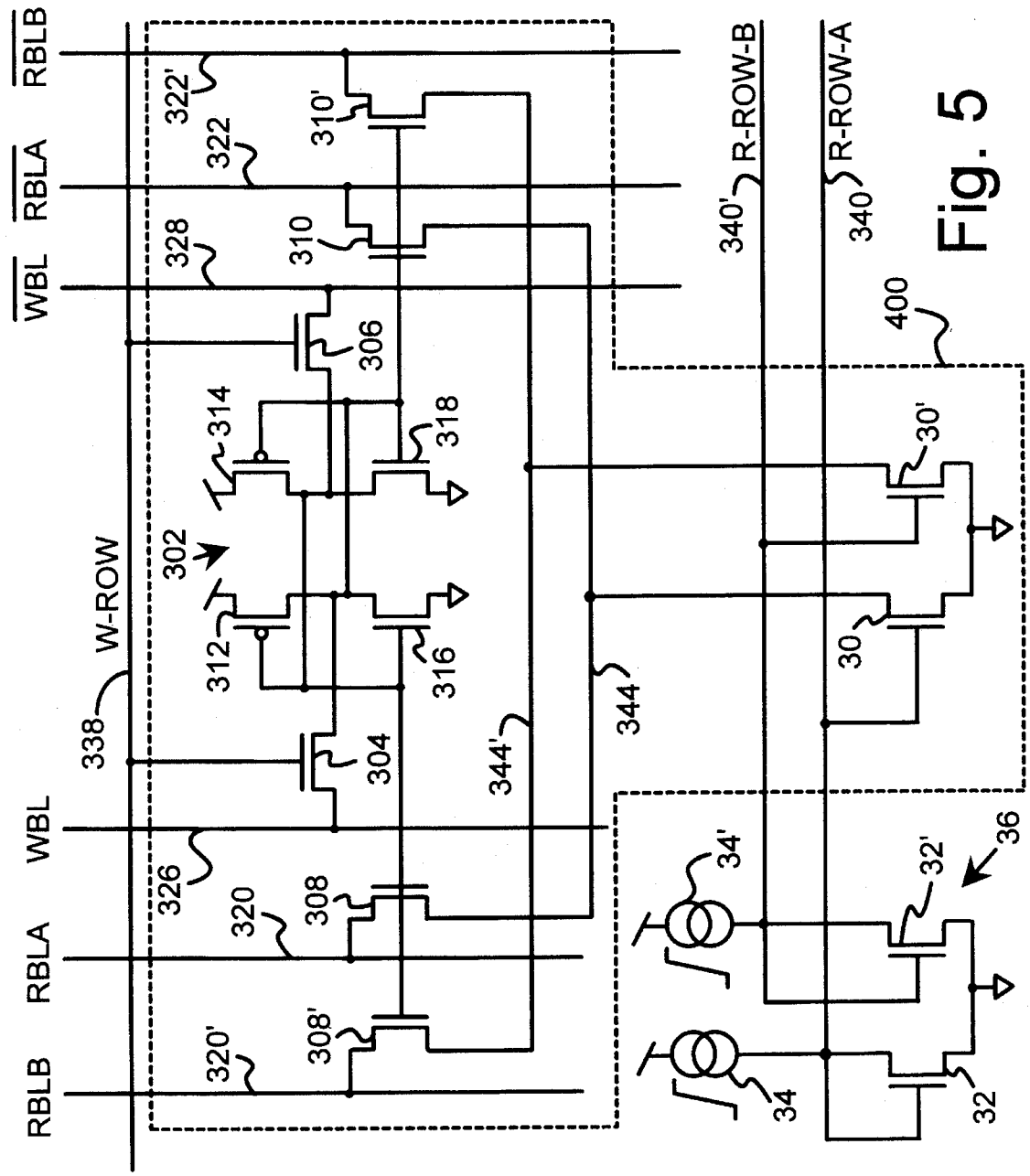
FIG. 5 shows the multi-port memory cell of FIG. 4 being driven by a current mirror row-line driver.

| Typical Device Sizes for FIG. 5 | | | |
|---|---|---|---|
| Transistor Type | FIG. 5 Ref. # | W | L |
| NMOS Driver | 316, 318 | 1.0 | 0.5 |
| PMOS Load | 312, 314 | 1.0 | 0.5 |
| NMOS Read | 308, 310, 308', 310' | 1.5 | 0.5 |
| NMOS Read Switch | 30, 30' | 2.5 | 0.5 |
| NMOS Write | 304, 306 | 1.0 | 0.5 |

Current Mirror Row Driver

While a standard push-pull row driver could be used to drive the row lines, a current-mirror row driver may be used, especially when a BiCMOS manufacturing process is used.

FIG. 5 shows multi-port memory cell 400 of FIG. 4 being driven by current-mirror row-line driver 36. Reference numerals for transistors, bit lines, and row lines in memory cell 400 are identical to those described above for FIG. 4. FIG. 5 shows row-line driver 36 driving read row line 340 for port "A", and read row line 340' for port "B". The placement of transistors in FIG. 5 emphasizes that the current in row driver 36 through saturation transistor 32 is mirrored to read switch transistor 30. Likewise, the current in row driver 36 through saturation transistor 32' is mirrored to read switch transistor 30'.

For port "A", a switchable current source 34 provides a current through saturation transistor 32 when a row-A select signal (not shown) activates switchable current source 34. Current source 34 may be implemented in a variety of ways, such as a PNP transistor or a p-channel MOS transistor. A resistor may even be used to approximate the current source. This current turns on saturation transistor 32, since there is no other path for the current to ground, as row line 340 is only connected to the gates of transistors.

The saturation region of transistor operation occurs when the drain-to-source voltage is more than a transistor threshold voltage below the gate-to-source voltage ($V_{DS} > V_{GS} - V_{th}$). Stated another way, the channel at the drain end of the gate is "pinched-off" because the gate-to-drain voltage is not above the transistor threshold voltage, so the transistor area near the drain cannot turn on and form a conduction channel beneath the drain side of the gate. The transistor is still conductive in the saturation region, as the gate-to-source voltage is above the transistor threshold voltage, and electrons can be propelled by an electric field from the conduction channel under the source-side of the gate through the pinched-off region near the drain to the drain junction.

The saturation region is useful since the current through the transistor depends on the gate voltage, but does not significantly depend on the drain voltage. Thus a transistor in saturation will act as a current source, with the current not primarily depending upon the drain voltage. Saturation transistor 32 has its gate connected to its drain, making $V_{gate-drain}$ always equal to zero. Since the threshold voltage of n-channel transistors is typically a small positive voltage, such as 0.5–0.7 volts, tying the drain to the gate ensures that saturation transistor 32 will always operate in the saturation region when it is conducting. Saturation transistor 32 thus acts as a NMOS FET diode, not being primarily dependent upon the drain voltage.

The current that flows through saturation transistor 32 is mirrored to read switch transistor 30 in memory cell 400. Since saturation transistor 32 and read switch transistor 30 both have their gates tied to row line 340, both transistors 32, 30 have identical gate-to-source voltages, $V_{GS}$. Thus if both transistors 32, 30 are operating in the saturation region, then both with have the same currents. Read switch transistor 30 can be made to conduct in the saturation region by ensuring that its drain voltage, the voltage on local node 344, is greater than the voltage on row line 340, or at least greater than voltage on row line 340 minus the threshold voltage. This design goal can be met by the choice of sizes of read transistors 308, 310 relative to read switch transistor 30, and the voltage bias on read bit lines 320, 322. The design of these transistor sizes and bit-line bias is well-known in the art of memory cell design, and depends upon the exact technology and manufacturing process used.

This design may be able to ignore the steady-state equilibrium voltages that occur long after row line 340 is first activated. In that case the design may allow read switch transistor 30 to leave the saturation region at equilibrium, as long as read switch transistor 30 initially operates in the saturation region.

If the high voltage bias is normally left on all bit lines, then at equilibrium local node 344 will rise to the bit-line bias, or possibly a transistor threshold below that bias, when row line 340 is turned off. As the row line 340 is turned on and its voltage rises, then read switch transistor 30 will also turn on and pull the voltage of local node 344 and the voltage of read bit line 320 or 322 down toward ground. Only after a significant voltage swing occurs on read bit line 320 or 322 will the voltage of local node 344 be low enough to possibly make read switch transistor 30 operate in the linear region rather than the saturation region. Since the sense amplifier should already have sensed the data in memory cell 400 by the time read switch transistor 30 leaves the saturation region, most or all of the time during the sensing of memory cell 400 should occur when read switch transistor 30 is in saturation. Thus at equilibrium read switch transistor 30 may even operate in the linear region, but still mirror current in saturation mode during the critical sensing time.

A transient current will flow from current source 34 into row line 340 to charge the capacitances and gates along row line 340. This will initially reduce the mirrored current as switched current source 34 is activated. Once a static voltage on row line 340 has been reached, this transient current will stop and the current source will provide a constant current through saturation transistor 32 that is mirrored to read switch transistors in the memory cells along the row.

Transistors can be Ratioed to Vary Read Currents for Different Ports

The current mirrored from row driver 36 is nearly identical to the current through saturation transistor 32 for all read switch transistors connected to row line 340 in all columns of memory cells. Thus there should be little or no variation in read currents for different columns in the memory array. This helps to provide a constant access time for different memory cells, regardless of their column or location in an array.

The mirrored currents will be approximately identical as long as the physical sizes of the transistors are equal. Transistor size is indicated by the width-to-length ratio, W/L. The current can still be mirrored if the read switch transistors are smaller or larger than the saturation transistor, although the mirrored current will be reduced or increased in proportion to the ratio of the sizes for the saturation and read switch transistors. It is anticipated that the saturation transistors in all row drivers will be of one size for efficient layout, while the read switch transistors will possibly have a different size. All read switch transistors for one port will normally have a fixed size, but different ports may have different sizes for read switch transistors to allow some ports to have a faster access time than other ports. Ratioing the sizes of the transistors allows the memory designer to vary the read current, and thus the access time for different rows of memory cells.

Additional read ports will have additional components, such as switchable current source 34' and saturation transistor 32' for driving additional row line 340'. Current in saturation transistor 32' is mirrored to read switch transistor 30' for port "B". Multiple read ports can be supported with these additional components.

Advantages of the Invention

The read transistors isolate the bistable storage latch from the read current, allowing the read current to be adjusted and optimized for the read access time without disturbing the D.C. stability of the bistable or the minimum write current to write data to the bistable storage latch. This greatly simplifies the design since the transistor sizes for the read transistors can be optimized independently of the sizes for the transistors in the bistable storage latch. Cell stability is ensured even when multiple ports read the data in the storage latch. The write performance is increased since the bistable transistors can be made smaller than when the bistable transistors have to sink the read current.

The invention achieves isolation without flowing the read currents down the row line. This avoids the problems of voltage drops along the row line affecting the read currents and access times of the cells. The problem of current summing in the row line and remote cells having larger I-R voltage drops and slower access times than close cells is also eliminated by the invention. The invention re-directs the read current through a read switch within the cell, and instead of the read current flowing into the row lines, the row lines control the isolated gates of these read switches.

Since only one row line is activated in the array, each vertical ground line will only have to carry current for one cell. Thus minimum-width vertical metal lines may be used for ground to the cells. Each ground line has to carry only the read currents for one cell, but in the prior art these read currents are summed in the row line and must ultimately be carried by a large, wide ground line in the row driver.

Problems of electromigration in the row lines because of the D.C. current is also eliminated. The memory decoders and bit-line bias generators may be simplified because all bit lines may be left in high bias even when not selected, as currents from these bit lines are not summed in the row lines.

While it may appear to be necessary to increase the size of the memory cell to accommodate the new read switch transistors, this may not always be true. Multi-port memory Cells are often limited by the wiring into the cell, because multiple bit lines and row lines often require metal wiring channels to keep resistance low. Transistors can usually be located directly under these metal wires, so often additional transistors do not cause the cell size to increase, as when the cell's size is limited by the number of metal wiring channels needed by the cell's I/O.

Current mirroring provides read currents that may be precisely controlled. Band-gap references or high-precision resistors integrated onto the chip can provide a precise reference voltage to the switchable current source. Precise control of the read currents minimizes changes in read currents due to process and temperature variations, thus giving a more constant access time. Ultimately, tighter control of the read current and access time allows the access time to be more aggressively specified and effectively faster.

Alternate Embodiments

Another embodiment, although not preferred, is contemplated by the inventor. Rather than connect the sources of read switch transistors 30, 30' directly to ground, these sources can be tied to a column-line connecting all such sources in a column of memory cells. This column-line would then be connected to the drain of another n-channel transistor whose source is grounded. This n-channel transistor would be gated or simply tied high, acting as a current sink. Alternately another type of current sink could be used, such as a bipolar transistor. Thus an active device is used as a current sink, rather than just using a ground line as a passive current sink. This embodiment is not preferred because crosstalk and coupling between different rows of memory cells can occur through the common column-line. Another disadvantage is that another metal line for the column-line is needed for each column of memory cells, possibly increasing the size of the memory cell and its array.

Figure 6:
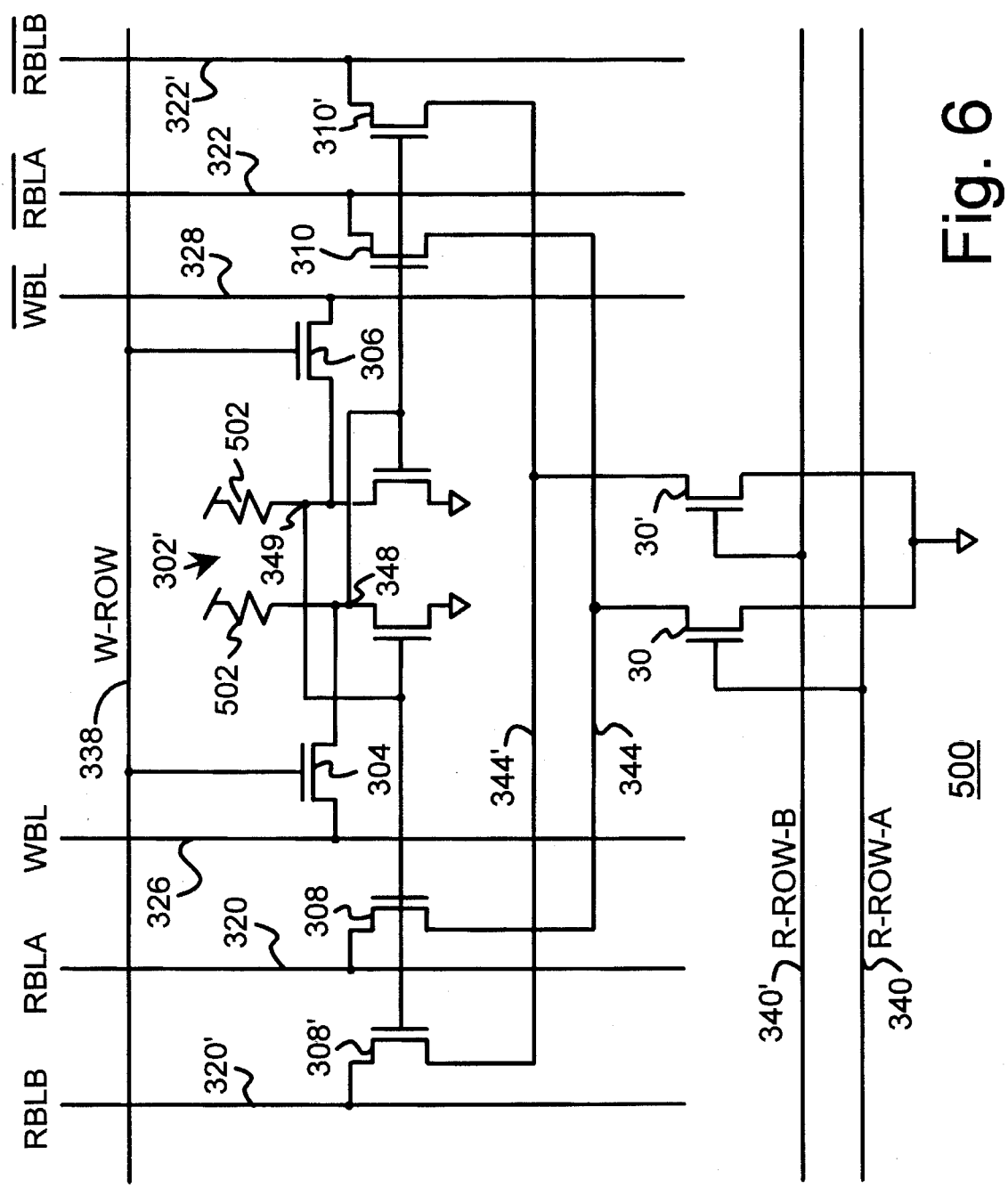
FIG. 6 is a schematic diagram of a multi-port memory cell with resistor pullups.

The bistable storage latch has been described as a pair of cross-coupled CMOS inverters,' each having a p-channel pull-up and an n-channel pull-down transistor. Another common bistable that can be substituted is one having cross-coupled inverters with the n-channel pull-down but without the p-channel pull-up transistors. FIG. 6 shows such a cell 500. High-resistance passive devices 502, 504 are substituted for the p-channel pull-up transistor. Lightly doped poly-silicon is often used for this resistor, or another type of high-resistance layer. Otherwise the cell 500 of FIG. 6 is similar to cell 400 of FIG. 4, and operates in a similar fashion. While a full CMOS bistable is considered more stable, with the invention the stability of the cell is less of a concern as the read posts are isolated from the bistable. Thus resistor pull-ups may be useful with the invention.

The local node does not have to be implemented in metal, but can exist as a short connection in diffusion between three gate regions. Many layout arrangements of the invention are possible.

Other technologies besides CMOS may be used to implement the invention. New transistor devices may be substituted that still have perfectly-isolating control gates such as thick oxides, or relatively-isolating control gates such as Galium-Arsenide (GaAs) field-effect transistors (FET's). In these devices the isolation of the control gate may not be as complete as with MOS gate oxides, since a small leakage current may flow from the gate through a reverse-biased junction or thin layer that acts as an insulator to a channel region in a substrate. The spirit of the invention is still met by these relatively-insulating devices as the bulk of the read current is not extracted from the bistable latch, nor does it flow down the row line.

The polarities of the devices and the biases of the bit lines and row lines may be reversed by those skilled in the art. Indeed, the direction of current flow is arbitrary, as current can be thought of as positive current of one carrier or negative current of a negative carrier, flowing in the opposite direction. While p-channel transistors are not currently preferred for read transistors because of the lower carrier mobility of holes, in the future this may change.

One contemplated use of p-channel transistors is for the write pass transistors. Using p-channel write transistors allows the write row lines to be active-low, which allows for efficient bipolar NPN row-line drivers. Read transistors may still be n-channel in this embodiment.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

I claim:

1. A multi-port memory comprising:
   a read row line for activating a row of memory cells; and
   a memory cell in said row of memory cells comprising:
   bistable storage means, having two stable states, for storing a bit of data;
   write means for changing from a first of said two stable states to a second of said two stable states of said bistable storage means;
   read port means for reading which of said two stable states is stored in said bistable storage means, said read port means comprising:
   differential read means for gating a read current in response to said bistable storage means, said differential read means isolating said bistable storage means from said read current wherein said read current is prevented from disturbing said bit of data stored in said bistable storage means; and
   read switch means, receiving said read current from said differential read means, for switching said read current to a current sink in response to said read row line, said read switch means isolating said read current from said read row line, whereby said read current flows through said differential read means and said read switch means to said current sink, but said read current is isolated from said bistable storage means and said read row line.

2. The multi-port memory of claim 1 wherein said read current flows through a first substrate channel electrically isolated from said bistable storage means by a first gate oxide, and wherein said read current flows through a second substrate channel electrically isolated from said read row line by a second gate oxide.

3. The multi-port memory of claim 2 wherein said first substrate channel and said first gate oxide comprise a first MOS transistor, and wherein said second substrate channel and said second gate oxide comprise a second MOS transistor.

4. The multi-port memory of claim 3 wherein said differential read means comprises said first MOS transistor and a third MOS transistor, a gate of said first MOS transistor coupled to a first internal node of said bistable storage means and a gate of said third MOS transistor coupled to a second internal node of said bistable storage means, said first and second internal nodes having opposite logic states.

5. The multi-port memory of claim 4 further comprising a first and a second read bit line, said first read bit line coupled to said first substrate channel of said first MOS transistor, said second read bit line coupled to a third substrate channel of said third MOS transistor, said first and second read bit lines biased at a voltage to allow conduction through either said first substrate channel or said third substrate channel in response to said bistable storage means when said read row line is activates said row of memory cells.

6. The multi-port memory of claim 5 wherein said read switch means comprises said second MOS transistor, said read row line connected to a gate of said second MOS transistor, said second substrate channel of said second MOS transistor having a source end of said second channel connected to a current sink and a drain end of said second channel coupled to said first MOS transistor and said third MOS transistor.

7. The multi-port memory of claim 6 wherein a local node connects said drain end of said second channel of said second MOS transistor and source ends of said first substrate channel of said first MOS transistor and said third substrate channel of said third MOS transistor, said local node being within said memory cell.

8. The multi-port memory of claim 6 wherein said current sink is a ground line.

9. The multi-port memory of claim 6 wherein said current sink is an active current sink.

10. The multi-port memory of claim 6 further comprising:
a row driver for driving a voltage on said read row line, said row driver comprising:
a switchable current source for supplying a row driver current in response to a row select signal, said switchable current source coupled to said row line;
a saturation transistor having a gate and a drain coupled to said row line, for sinking said row driver current to ground, said row driver current fixing a voltage of said row line;
whereby Said row driver current flowing through said saturation transistor is mirrored to determine said read current flowing through said read switch means.

11. The multi-port memory of claim 10 wherein said switchable current source comprises a p-channel MOS transistor.

12. The multi-port memory of claim 7 wherein said first, second, and third MOS transistors are n-channel MOS transistors.

13. The multi-port memory of claim 1 further comprising:
a second read row line for activating a second read port to said row of memory cells;
a second read port means for reading which of said two stable states is stored in said bistable storage means, said second read port means comprising:
second differential read means for gating a second read current in response to said bistable storage means, said second differential read means isolating said bistable storage means from said second read current wherein said second read current is prevented from disturbing said bit of data stored in said bistable storage means; and
second read switch means, receiving said second read current from said second differential read means, for switching said second read current to a current sink in response to said second read row line, said second read switch means isolating said second read current from said read row line,
whereby said second read port means and said read port means can both access said bistable storage means.

14. The multi-port memory of claim 13 wherein said second differential read means comprises a fourth MOS transistor and a fifth MOS transistor, a gate of said fourth MOS transistor coupled to said first internal node of said bistable storage means and a gate of said fifth MOS transistor coupled to said second internal node of said bistable storage means, said second read current flowing through a substrate channel of either said fourth MOS transistor or said fifth MOS transistor, said second read current isolated from said bistable storage means by a gate oxide.

15. The multi-port memory of claim 14 wherein said second read switch comprises a sixth MOS transistor, said second read current flowing through a substrate channel in said sixth MOS transistor, electrically isolated from said read row line by a gate oxide of said sixth MOS transistor.

16. The multi-port memory of claim 15 wherein said read current and said second read current have substantially different values, and wherein said read port means has a first access time to read said bit of data in said bistable storage means, said second read port means having a second access time to read said bit of data in said bistable storage means, wherein said first access time is substantially different from said second access time.

17. The multi-port memory of claim 16 wherein said read port means is coupled to a first stage in a pipelined processor having a first requirement for said first access time, and wherein said second read port means is coupled to a second stage in a pipelined processor having a second requirement for said second access time, said first requirement being substantially different from said second requirement.

18. The multi-port memory of claim 13 wherein said bistable storage means comprises a pair of cross-coupled CMOS inverters.

19. The multi-port memory of claim 13 wherein said bistable storage means comprises a pair of cross-coupled inverters, each inverter of said pair of cross-coupled inverters having an n-channel pull-down MOS transistor and a pull-up resistor.

20. A multi-port memory comprising:
a write row line for selecting a row of memory cells for writing;
write bit lines for transmitting a bit of data to a memory cell for writing to said memory cell;
a read row line for activating said row of memory cells for reading to a first read port;

a first pair of read bit lines for transmitting said bit of data in said memory cell for sensing by a sense amplifier for said first read port;

said memory cell in said row of memory cells comprising:
  storage means for storing said bit of data, said storage means having a first internal node and a complement internal node;
  write pass transistors, coupled to conduct current between said write bit lines and in response to said write row line;
  a local node within said memory cell, said local node separate from said first internal node and said complement internal node;
  isolated read transistors, having isolated control gates coupled to said first internal node and said complement internal node, for conducting a read current from said first pair of read bit lines to said local node;
  a read switch transistor, for switching said read current from said local node to a current sink in response to said read row line, said read switch transistor having an isolated control gate coupled to said read row line;

wherein said read current is supplied from one of said first pair of read bit lines when said read row line is in an active state, said bit of data determining which read bit line of said first pair of read bit lines will supply said read current, said sense amplifier sensing which read bit line of said first pair of read bit lines supplies said read current and outputting said bit of data in response.

21. The multi-port memory of claim 20 further comprising:

a second read row line for activating said row of memory cells for reading to a second read port;

a second pair of read bit lines for transmitting said bit of data in said memory cell for sensing by a second sense amplifier for said second read port;

said memory cell in said row of memory cells further comprising:
  a second local node within said memory cell, said second local node separate from said first internal node and said complement internal node and said local node;
  second isolated read transistors, having isolated control gates coupled to said first internal node and said complement internal node, for conducting a second read current from said second pair of read bit lines to said second local node;
  a second read switch transistor, for switching said second read current from said second local node to said current sink in response to said second read row line, said second read switch transistor having an isolated control gate coupled to said second read row line;

wherein said second read current is supplied from one of said second pair of second read bit lines when said second read row line is in an active state, said bit of data determining which read bit line of said second pair of read bit lines will supply said second read current, said second sense amplifier sensing which read bit line of said second pair of read bit lines supplies said second read current and outputting said bit of data in response, whereby two read ports and one write port may access said memory cell.

* * * * *